United States Patent
Kannan et al.

(10) Patent No.: US 11,975,547 B2
(45) Date of Patent: May 7, 2024

(54) FLUID EJECTION CONTROLLERS TO PIVOTALLY HOLD FIRING BOARDS

(71) Applicant: HEWLETT-PACKARD DEVELOPMENT COMPANY, L.P., Spring, TX (US)

(72) Inventors: Vignesh Kannan, Corvallis, OR (US); Dennis R. Esterberg, Corvallis, OR (US); Christie Dudenhoefer, Corvallis, OR (US); Kenneth Ward, Corvallis, OR (US); Matthew David Smith, Corvallis, OR (US); Daniel Fradl, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 430 days.

(21) Appl. No.: 17/608,078

(22) PCT Filed: Jul. 1, 2019

(86) PCT No.: PCT/US2019/040112
§ 371 (c)(1),
(2) Date: Nov. 1, 2021

(87) PCT Pub. No.: WO2021/002839
PCT Pub. Date: Jan. 7, 2021

(65) Prior Publication Data
US 2022/0322538 A1    Oct. 6, 2022

(51) Int. Cl.
*B41J 29/13*    (2006.01)

(52) U.S. Cl.
CPC ......... *B41J 29/13* (2013.01); *B01L 2200/025* (2013.01); *B01L 2200/0642* (2013.01);
(Continued)

(58) Field of Classification Search
CPC ...... H01R 12/88; H01R 12/72; H01R 12/724; H01R 12/722; H01R 12/73; H05K 3/30;
(Continued)

(56) References Cited

U.S. PATENT DOCUMENTS

| 4,679,483 A | 7/1987 | Wrana |
| 4,992,648 A | 2/1991 | Hutchison |

(Continued)

FOREIGN PATENT DOCUMENTS

WO    WO-2019117937 A1    6/2019

*Primary Examiner* — Renee S Luebke
*Assistant Examiner* — Paul D Baillargeon
(74) *Attorney, Agent, or Firm* — Foley & Lardner LLP

(57) ABSTRACT

In one example in accordance with the present disclosure, a fluid ejection controller is described. The fluid ejection controller includes a firing board to pass control signals to a fluid ejection device to eject fluid from the fluid ejection device. A mount pivotally holds the firing board between a disengaged position where electrical pins of the firing board are not in contact with electrical pads of the fluid ejection device and an engaged position where the electrical pins are in contact with the electrical pads. The mount includes a slot to receive the fluid ejection device and at least one biasing spring to bias the firing board away from the fluid ejection device during insertion of the fluid ejection device. The fluid ejection controller also includes a handle coupled to a cam shaft to move the firing board between the disengaged position and the engaged position.

15 Claims, 12 Drawing Sheets

(52) U.S. Cl.
CPC ............... *B01L 2300/0609* (2013.01); *H05K 2201/10424* (2013.01); *H05K 2201/10954* (2013.01)

(58) Field of Classification Search
CPC .......... H05K 2201/10424; H05K 2201/10954; G05D 16/00; G05D 16/20; G05D 16/2006; G05D 16/2086; G05D 16/2093; B41J 2/14072; B41J 29/13; B01L 2300/0609; B01L 2200/025
See application file for complete search history.

(56) References Cited

U.S. PATENT DOCUMENTS

| | | | |
|---|---|---|---|
| 5,413,493 A | | 5/1995 | Hoffman |
| 5,807,104 A | * | 9/1998 | Ikeya ................... G01R 1/0483 439/912 |
| 6,428,225 B1 | | 8/2002 | Nguyen et al. |
| 6,699,437 B1 | | 3/2004 | Astle |
| 7,407,396 B2 | | 8/2008 | Dillon et al. |
| 7,686,637 B2 | * | 3/2010 | Yi ......................... H05K 7/1007 439/259 |
| 8,253,030 B2 | | 8/2012 | Kariya et al. |
| 8,608,504 B2 | * | 12/2013 | Tseng ................. H01R 13/6471 439/497 |
| 11,639,056 B2 | * | 5/2023 | Smith ................. B41J 2/14201 347/50 |
| 2006/0014402 A1 | * | 1/2006 | Perino ................ H01R 12/7076 439/73 |
| 2008/0115599 A1 | * | 5/2008 | Masters ............ B01L 3/502715 73/866 |
| 2018/0113068 A1 | | 4/2018 | Weber |
| 2018/0147852 A1 | * | 5/2018 | Gonzalez Perello .... B41J 25/34 |

\* cited by examiner

FLUID EJECTION CONTROLLERS TO PIVOTALLY HOLD FIRING BOARDS

CROSS-REFERENCE TO RELATED APPLICATIONS

This Utility Patent Application is a U.S. National Stage filing under 35 U.S.C. § 371 of PCT/US2019/040112, filed 1 Jul. 2019, incorporated by reference herein.

BACKGROUND

An assay is a process used in laboratory medicine, pharmacology, analytical chemistry, environmental biology, and molecular biology to assess or measure the presence, amount, or functional activity of a sample. The sample may be a drug, a genomic sample, a proteomic sample, a biochemical substance, a cell in an organism, an organic sample, or other inorganic and organic chemical samples. In general, an assay is carried out by dispensing small amounts of fluid into multiple wells of a titration plate. The fluid in these wells can then be processed and analyzed. Such assays can be used to enable drug discovery as well as facilitate genomic and proteomic research.

BRIEF DESCRIPTION OF THE DRAWINGS

The accompanying drawings illustrate various examples of the principles described herein and are part of the specification. The illustrated examples are given merely for illustration, and do not limit the scope of the claims.

Figure 1A:
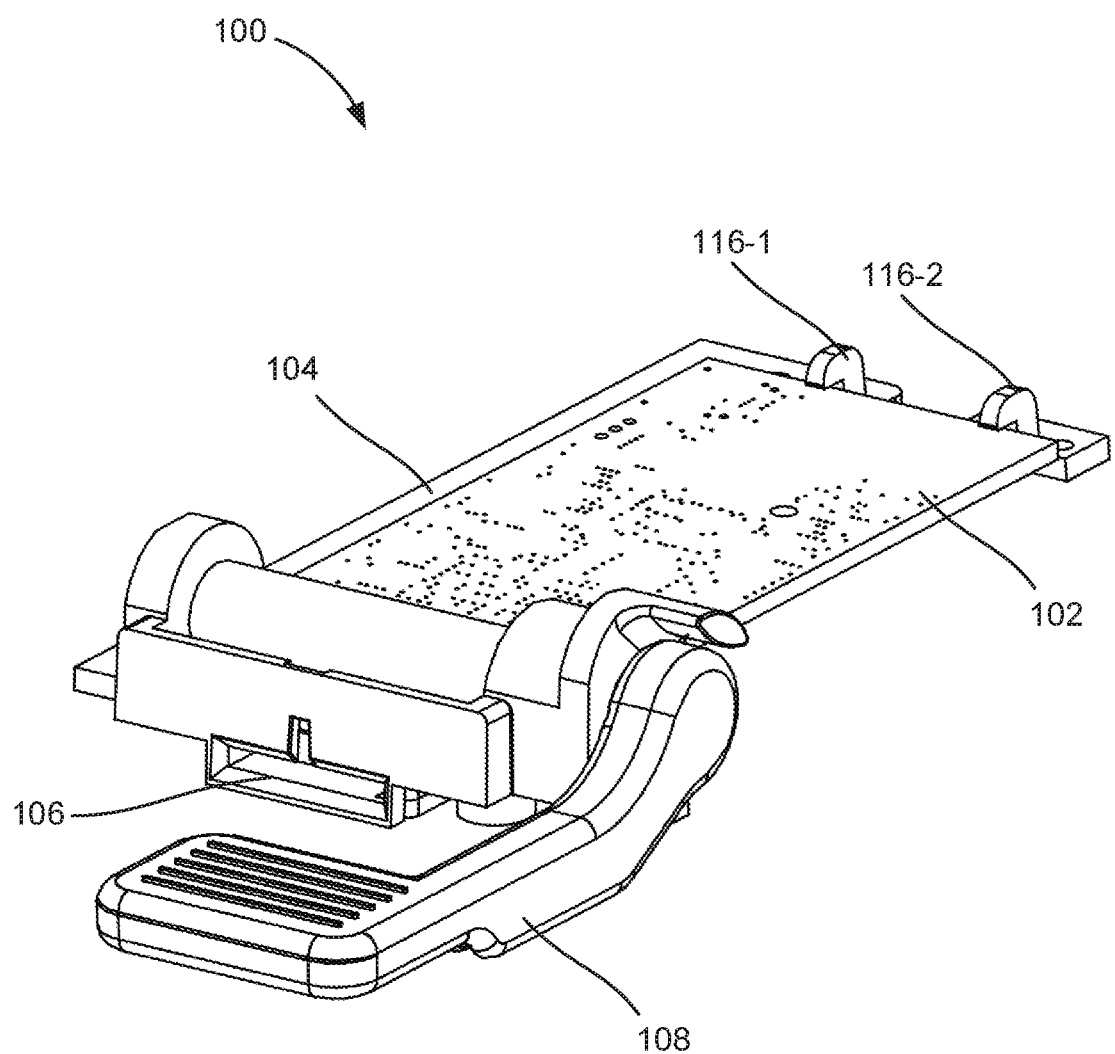
FIGS. 1A and 1B are diagrams of a fluid ejection controller for pivotally holding a fluid ejection firing board, according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

An assay is a process used in laboratory medicine, pharmacology, analytical chemistry, environmental biology, and molecular biology to assess or measure the presence, amount, or functional activity of a sample. The sample may be a drug, a genomic sample, a proteomic sample, a biochemical substance, a cell in an organism, an organic sample, or other inorganic and organic chemical samples. In general, an assay is carried out by dispensing small amounts of fluid into multiple wells of a titration plate. The fluid in these wells can then be processed and analyzed. Such assays can be used to enable drug discovery as well as facilitate genomic and proteomic research.

Such assays may be performed manually. In this scenario, a user fills fluid into a single channel pipette, or a multi-channel pipette, and manually disperses a prescribed amount of fluid from the pipette into various wells of a titration plate. As this process is done by hand, it is tedious, complex, and inefficient. Moreover, it is prone to error as a user may misalign the pipette with the wells of the titration plate and/or may disperse an incorrect amount of fluid.

The present specification describes a fluid ejection system that automatically ejects predetermined amounts of fluid into the wells of a titration plate. In these examples, a controller activates an ejecting component that ejects an amount of fluid into the various wells of a titration plate. The system also handles the titration plate to ensure proper alignment of the ejecting device and the wells of the titration plate.

While specific reference is made to deposition of fluid into wells of a titration plate, the present systems and devices can be used to deposit fluid on other substrates or surfaces such as microscope slides, matrix assisted laser desorption/ionization (MALDI) plates, petri dishes, and microfluidic chips among other substrates or surfaces.

In one particular example, the fluid ejection system is a thermal inkjet (TIJ)-based system for dispensing solvent-based pharmaceutical compounds and aqueous-based biomolecules including proteins, enzymes, lipids, mastermix, and DNA samples. Specifically, the fluid ejection system dispenses picoliter quantities of fluids into well plates or any other substrate using disposable cassettes also referred to as fluid ejection devices.

During use, a disposable fluid ejection device is inserted into the fluid ejection system establishing an electrical connection between 1) the fluid ejection device, which includes the fluid ejection components and 2) the fluid ejection system, which system includes the hardware components to control the fluid ejection process. To establish such a connection, electrical pins on the fluid ejection system are pushed against electrical pads on the fluid ejection device. For example, spring-loaded pins may be vertically mounted onto a firing board. The spring-loaded pins are vertical and engage with a fluid ejection device that is inserted horizontally into a slot. The action of engaging a fluid ejection device can wear or even damage the spring-loaded pins and finally lead to no electrical connection.

That is, over the life of the fluid ejection system, hundreds and maybe even thousands of fluid ejection devices may be inserted into the fluid ejection system. Such a high quantity of insertions and removals may wear down the electrical pins that form the electrical path between the fluid ejection system and the fluid ejection device. Deterioration of these electrical pins can render the entire fluid ejection system inoperable as a control signal cannot be reliably passed. The damage may be significant enough that no signal at all can be passed and a user will either have to purchase a new fluid ejection system or perform a costly repair. In either case, the valuable assays and other operations performed using such a fluid ejection system are impeded.

Accordingly, the present specification describes a fluid ejection controller that preserves the state of the electrical pins thereby prolonging the number of insertion events that can take place before the electrical pins deteriorate. Thus, the present specification describes a fluid ejection controller that increases the reliability and robustness of the fluid ejection system as a whole.

Specifically, the present specification describes a fluid ejection controller that includes a manual mechanism that enables a firing board with a connector to make electrical connection with a fluid ejection device after being inserted into a fluid ejection system horizontally while eliminating the chances for connectors being damaged or worn during insertion and removal. Such a controller includes a floating firing board that is pivotally connected to a mount and biased away from the slot where the fluid ejection device is inserted. Accordingly, during insertion/removal of the fluid ejection device, the electrical pins are elevated such that the fluid ejection device is inserted/removed without contacting the electrical pins. Once the fluid ejection device is in place, the firing board is rotated down such that the electrical pins interface with the electrical pads on the fluid ejection device making the electrical connection which facilitates fluid ejection.

Specifically, the present specification describes a fluid ejection controller. The fluid ejection controller includes a firing board to pass control signals to a fluid ejection device to eject fluid from the fluid ejection device. The fluid ejection controller also includes a mount. The mount pivotally holds the firing board between a disengaged position wherein electrical pins of the firing board are not in contact with electrical pads of the fluid ejection device and an engaged position wherein the electrical pins are in contact with the electrical pads. The mount includes 1) a slot to receive the fluid ejection device and 2) at least one biasing spring to bias the firing board away from the fluid ejection device during insertion of the fluid ejection device. The fluid ejection controller also includes a handle coupled to a cam shaft to move the firing board between the disengaged position and the engaged position.

The present specification also describes a fluid ejection system that includes a base and a stage disposed on the base to receive a substrate onto which fluid is ejected. A housing of the fluid ejection system is vertical to the stage and holds the fluid ejection controller. The fluid ejection controller includes a firing board to pass control signals to a fluid ejection device to eject fluid from the fluid ejection device. The fluid ejection controller also includes a mount which pivotally holds the firing board between a disengaged position wherein electrical pins of the firing board are not in contact with electrical pads of the fluid ejection device and an engaged position wherein the electrical pins are in contact with the electrical pads. The mount includes 1) a slot to receive the fluid ejection device and 2) at least one biasing spring to bias the firing board away from the fluid ejection device during insertion of the fluid ejection device. The fluid ejection system also includes a handle coupled to a cam shaft to move the firing board between the disengaged position and the engaged position.

In some examples, the fluid ejection controller includes a floating firing board that includes spring-loaded electrical pins to compress against electrical pads on a fluid ejection device to pass control signals to eject fluid from the fluid ejection device. A mount of the fluid ejection controller pivotally holds the firing board between a disengaged position wherein the spring-loaded electrical pins are not in contact with the electrical pads and an engaged position wherein the electrical pins are in contact with the electrical pads. The mount includes 1) a hook at one end to pivotally retain the floating firing board, 2) a slot at an opposite end to receive the fluid ejection device, 3) at least one biasing spring on one side of the floating firing board to bias the firing board away from the fluid ejection device during insertion of the firing board; and 4) at least one bearing to rotationally couple the handle to the mount. The fluid ejection controller also includes a handle coupled to a cam shaft on a second side of the floating firing board to move the firing board between the disengaged position and the engaged position. The fluid ejection controller also includes a mounting surface on which the mount is placed.

In summary, using such a fluid ejection controller with a floating firing board 1) reduces fluid ejection system cost; 2) is more robust in that it protects the electrical pins by holding the electrical pins away from the slot with the help of biasing springs underneath the firing board while the user disengages the connection by rotating a cam-style handle; 3) reduces likelihood of accidental fluid ejection device removal or insertion; 4) enhances connector reliability with a slot obstructing feature; and 5) provides a visual aid as to when the fluid ejection device is properly inserted and fluid ejection may begin. However, it is contemplated that the devices disclosed herein may address other matters and deficiencies in a number of technical areas.

As used in the present specification and in the appended claims, the term "a number of" or similar language is meant to be understood broadly as any positive number including 1 to infinity.

Further, as used in the present specification and in the appended claims, the term "firing board" refers to a component of the fluid ejection controller that includes hardware components and controls the fluid ejection. For example, the firing board may pass signals that instruct an actuator of the cassette to activate and dispel an amount of fluid. In some examples, the firing board may include remote components that wirelessly connect to the fluid ejection device to expel fluid.

Figure 1B:
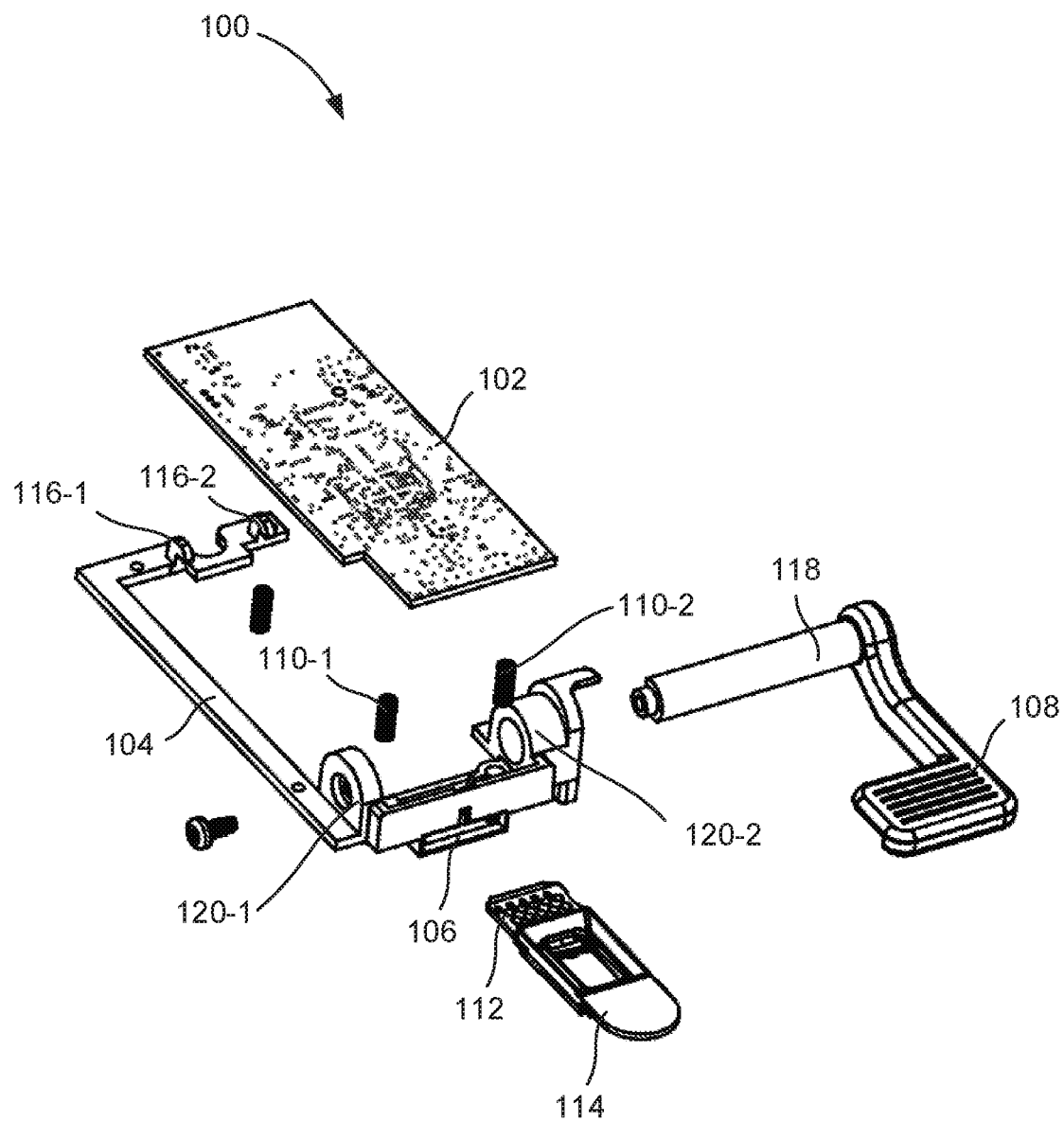

Turning now to the figures, FIGS. 1A and 1B are diagrams of a fluid ejection controller (100) for pivotally holding a fluid ejection firing board (102), according to an example of the principles described herein. Specifically, FIG. 1A is an assembled view and FIG. 1B is an exploded view.

As described above, the fluid ejection controller (100) is a component of a fluid ejection system, which fluid ejection system operates to eject fluid. For example, the fluid could be ejected into wells of a titration plate. To eject the fluid, the fluid ejection controller (100) receives control signals and routes them to a fluid ejection device (114) which is inserted into the fluid ejection controller (100). For simplicity, FIG. 1A does not depict the fluid ejection device (114) while FIG. 1B does.

The fluid ejection controller (100) includes a firing board (102). The firing board (102) includes the circuitry and other hardware to receive control signals and pass those control signals to the fluid ejection device to eject fluid from the fluid ejection device. Any number of control signals may be passed. For example, ejection signals may activate actuators on the fluid ejection device to eject fluid therefrom. Other types of signals include sensing signals to activate a sensor to collect data regarding the fluid ejection device or a fluid passing through the fluid ejection device. While specific reference is made to particular control signals generated and/or passed by the firing board, any number and type of control signals may be passed to the fluid ejection device by the fluid ejection controller (100) through the firing board (102).

The firing board (102) includes pins that pass through a slot (106) in the firing board mount (104). It is these pins that establish an electrical connection with the inserted fluid ejection device such that the control signals may be passed to the firing mechanisms on the fluid ejection device. That is, via an electrical connection, control signals from the firing board (102) that originate within the fluid ejection system, are passed through to the fluid ejection device.

The fluid ejection controller (100) also includes a mount (104) to pivotally hold the firing board (102) between a disengaged position and an engaged position. That is, as described above, the firing board (102) may be a floating firing board (102) that changes between a disengaged position where the electrical pins of the firing board (102) are not in contact with electrical pads of the fluid ejection device (114) and an engaged position wherein the electrical pins are in contact with the electrical pads.

The mount (104) includes at least one biasing spring (110) to bias the firing board (102) away from the fluid ejection device during insertion of the fluid ejection device. As depicted in FIG. 1B, in some examples, the at least one biasing spring (110) includes two biasing springs (110-1, 110-2) on either side of the slot (106) where the fluid ejection device is received.

The mount (104) also includes a slot (106) to receive the fluid ejection device (114). That is, a portion of the fluid ejection device (114) is inserted into the slot (106) such that the electrical pins may be engaged with the electrical contact pads on the fluid ejection device (114).

The fluid ejection controller (100) also includes a handle (108). The handle (108) is the mechanism by which the firing board (102) is moved between the disengaged position and the engaged position. Specifically, the handle (108) is coupled to a cam shaft (118) that moves the firing board (102) between the disengaged and the engaged positions. Using such a system, which includes a floating firing board (102), the life of the fluid ejection system is extended as the electrical pins, which may be spring-loaded and fragile, are not contacted until after the fluid ejection device (114) is inserted. In other examples where the spring-loaded pins are permanently extended down, they may be forced up by the insertion of the fluid ejection device (114). The horizontal force of inserting the fluid ejection device (114) may break or otherwise wear down the electrical pins.

FIG. 1B is an exploded view of the fluid ejection controller (100) and illustrates components hidden in FIG. 1A. Specifically, FIG. 1B depicts the floating firing board (102) which includes spring-loaded electrical pins that compress against electrical pads (112) on a fluid ejection device (114) to pass control signals to eject fluid from the fluid ejection device (114). FIG. 1B also depicts the mount (104) to pivotally hold the firing board (102) between a disengaged position wherein the spring-loaded electrical pins are not in contact with the electrical pads (112) and an engaged position wherein the electrical pins are in contact with the electrical pads (112).

FIG. 1B also depicts hooks (116-1, 116-2) at one end to pivotally retain the floating firing board (102). The biasing springs (110-1, 110-2) are disposed on one side, i.e., underneath, the firing board (102) and bias the firing board (102) away from the fluid ejection device (114) during insertion of the fluid ejection device (114). That is, the firing board (102) pivots about an axis defined by the hooks (116). As depicted in FIG. 1B, the hooks (116) are at one end of the firing board (102) and the biasing springs (110) are at an opposite end. FIG. 1B also depicts the slot (106) that is also at an opposite end from the hooks (116). The slot (106) receives the fluid ejection device (114) such that the electrical pins are aligned with the electrical pads (112).

FIG. 1B also depicts the handle (108) coupled to the cam shaft (118). The handle (108) is disposed on a second side, i.e., above, of the floating firing board (102) and moves the firing board (102) between a disengaged position and an engaged position. That is, as a user depresses the handle (108), the asymmetric nature of the cam shaft (118) compresses the biasing springs (110) and moves the firing board (102) down such that the electrical pins contact the electrical pads (112) thus establishing the electrical connection to effectuate fluid ejection.

FIG. 1B also depicts the bearings (120) through which the cam shaft (118) passes. The bearings (120-1, 120-2) allow the rotation of the handle (108) which engages/disengages the firing board (102).

In some examples, the mount (104) may be formed of a polymer material, such as a self-lubricating material or a material with a low coefficient of friction. In one specific example, the mount (104) may be formed of polyoxymethylene. Such a compound facilitates the rotation of the cam shaft (118) against the bearings (120) and also facilitates the friction between the slot (106) and the fluid ejection device (114). That is, repeated insertion and rotation of the handle (108) may cause deterioration of the components. Accordingly, by forming the mount (104) and its associated components out of a self-lubricating material, the effects of the friction force are reduced.

In summary, the fluid ejection controller (100) includes a handle (108), a firing board (102), a firing board mount (104) and biasing springs (110). The handle (108) has a cam shaft (118) that goes through bearings (120) that are part of the mount (104). The cam shaft (118) may be coupled to the mount (104) with the help of a fastener that has a larger perimeter or circumferential geometry than that of a hole in the bearing (120) out of which the cam shaft (118) protrudes to lock the handle (108) in place. The mount (104) is such that the firing board (104) remains unfastened. The firing board (102) X-Y movement is controlled by the face of the mount (104) bearings (120) and hooks (116), whereas the Z movement is controlled by two flat faces on the cam shaft (118) which is in contact with the top of the firing board (102). The mount (104) also includes pockets where the biasing springs (110) are placed, on top of which the firing board (102) rests. The mount (104) has a slot (106) where a fluid ejection device (114) is inserted.

Figure 2:
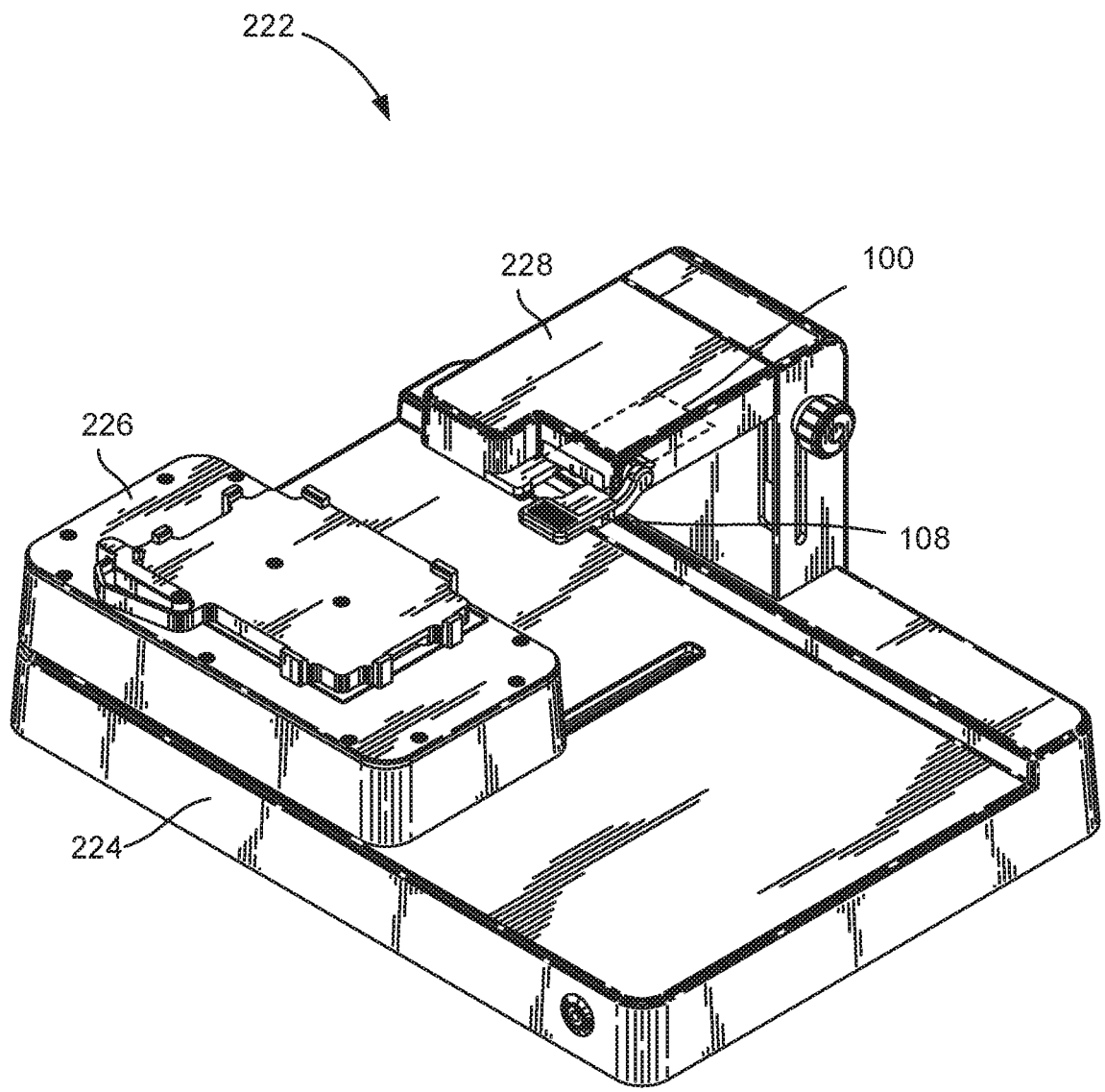
FIG. 2 is an isometric view of a fluid ejection system for pivotally holding a fluid ejection firing board, according to an example of the principles described herein.

FIG. 2 is an isometric view of a fluid ejection system (222) for pivotally holding a fluid ejection firing board (FIG. 1, 102), according to an example of the principles described herein.

In general, the fluid ejection system (222) includes a fluid ejection controller (100) that receives a fluid ejection device (FIG. 1, 114). From the fluid ejection device (FIG. 1, 114), fluid is ejected onto a surface, such as wells of a titration plate. In some examples, the fluid ejection device (FIG. 1, 114) dispenses picoliter quantities of a target fluid into microtiter plates. Each fluid ejection device (FIG. 1, 114) includes a fluid ejection die that may rely on inkjet technology to eject fluid therefrom. Such a fluid ejection system (222), by using inkjet components such as ejection chambers, openings, and actuators disposed within the micro-fluid ejection chambers, enables low-volume dispensing of fluids such as those used in life science and clinical applications.

The fluid dispensed by the fluid ejection device (100) may be of a variety of types and may be used for a variety of applications. For example, the fluid ejection device (100) may dispense solvent or aqueous-based pharmaceutical compounds and aqueous-based biomolecules including, for example, proteins, enzymes, lipids, mastermix, DNA samples, among others, into wells of a titration plate or onto other types of substrates (150). Such fluid ejection systems (222) may be used in titration processes, compound secondary screening, enzyme profiling, and polymerase chain reactions (PCR), among other chemical and biochemical reactions. Other examples of applications where such a fluid ejection system (222) is used include dose-response titrations, polymerase chain reaction (PCR) miniaturization, microarray printing, drug-drug combination testing, drug repurposing, drug metabolism and pharmacokinetics (DMPK) dispensing and a wide variety of other life science dispensing.

The fluid ejection system (222) includes a base (224) to hold a stage (226) that is movably coupled to the base (224). The stage (226) receives a substrate onto which fluid is ejected, which substrate may take a variety of forms including a titration plate. The substrate stage (226) moves as instructed by a processing device in order to place the substrate into a desired position underneath the fluid ejection device (FIG. 1, 114) which is disposed in a housing (228).

In some examples, the substrate stage (226) includes a mount to retain the substrate in a fixed position relative to the substrate stage (226). In this manner, the substrate is secured to the substrate stage (226) and remains in place during movement of the substrate stage (226) relative to the base (224) when fluid from the fluid ejection device (FIG. 1, 114) is dispensed onto the various portions of the substrate.

The fluid ejection system (222) includes a housing (228) that is vertical to the stage (226) and holds the fluid ejection controller (100) which is to receive the fluid ejection device (FIG. 1, 114). In the example depicted in FIG. 2, the fluid ejection controller (100) is depicted in dash to indicate its position internal to the housing (228). In some examples, the housing (228) rests on a vertical support that extends from the base (224) and is movable in an X, Y, and Z direction relative to the base (224). Such movement allows the housing (228) and inserted fluid ejection device (FIG. 1, 114) to align with, and deposit fluid onto different portions of the substrate.

In one particular example, of the use of the fluid ejection system (222). The system (222) may utilize thermal inkjet fluid ejection devices (FIG. 1, 114) to dispense picoliter droplets into well plates. The fluid ejection device (FIG. 1, 114) may be inserted into the housing (228) through the slot (FIG. 1, 106) while the electrical pins are retracted. Once inserted, the handle (108) may be lowered to form an electrical connection between the fluid ejection device (FIG. 1, 114) and the control circuitry in the fluid ejection system (222) or received by the fluid ejection system (222). Once an electrical connection is established, and in some cases, verified, a pharmaceutical compound, such as a kinase inhibitor drug in an aqueous solution could be placed in an open reservoir of the fluid ejection device (FIG. 1, 114). The fluid ejection system (222) then passes control signals to the fluid ejection device (FIG. 1, 114) to activate the inkjet dispensers disposed thereon to dispense the kinase inhibitor drug into wells of a titration plate. By placing from one to hundreds of thousands of these drops into a series of wells containing assay reagents, such as an anti-ADP antibody, a series of doses of a compound are directly generated into the set of wells. Such an operation may be referred to as direct dilution. Such a method may more precise, faster, use less compound, and allow for better design experiments for drug combination studies.

Figure 3:
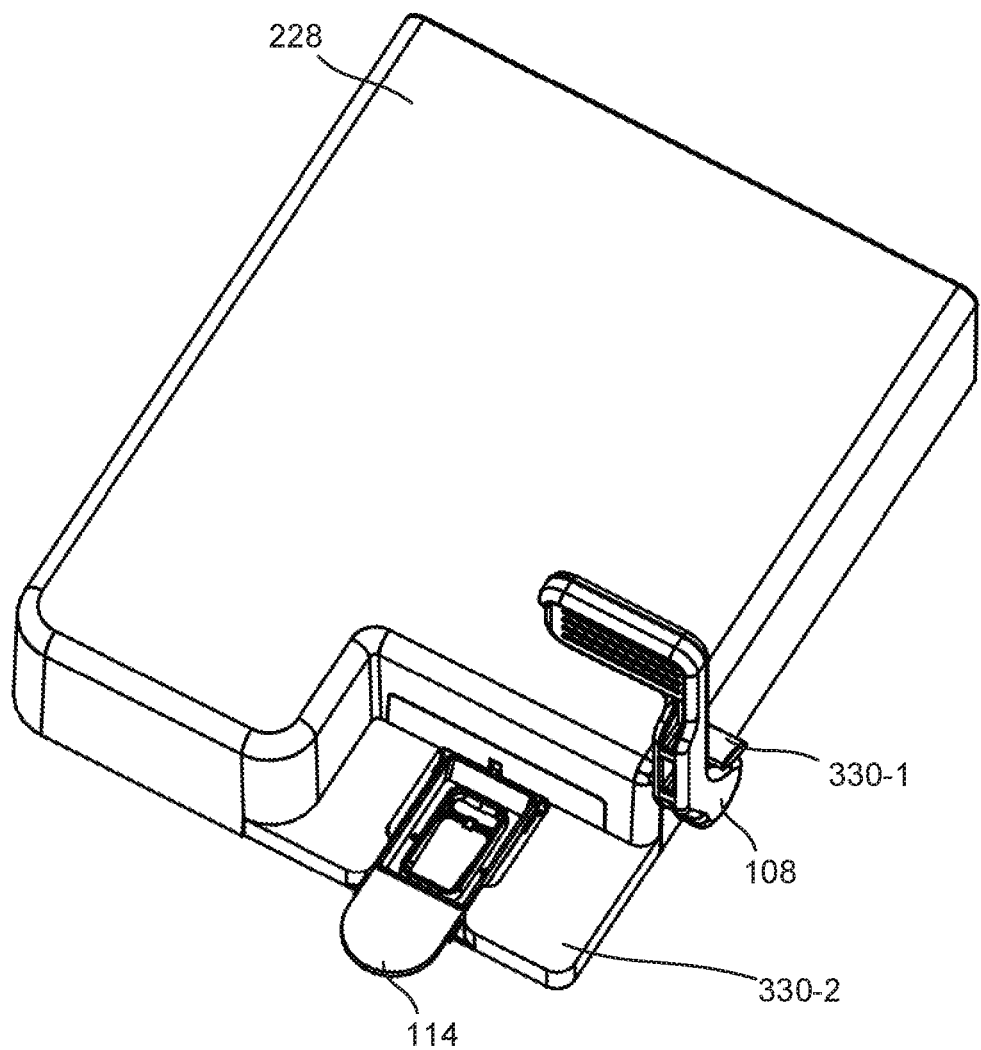
FIG. 3 is a zoomed in isometric view of a housing of a fluid ejection system for pivotally holding a fluid ejection firing board, according to an example of the principles described herein.

FIG. 3 is a zoomed in isometric view of a housing (228) of the fluid ejection system (FIG. 2, 222) for pivotally holding a fluid ejection firing board (FIG. 1, 102), according to an example of the principles described herein. As clearly depicted in FIG. 3, a fluid ejection device (114) is inserted into the slot (FIG. 1, 106). In the example depicted in FIG. 3, the handle (108) is in a disengaged position. Note that in some examples, the housing (228) includes at least one stop (330-1, 330-2) to define a range of motion of the handle (108). For example, if the handle (108) were allowed to rotate too far towards the fluid ejection device (114) it may exert too much force on the electrical pins and/or electrical pads (FIG. 1, 112) so as to damage them. If the handle (108) were allowed to rotate too far away from the fluid ejection device (114), it may affect the ability of the cam shaft (FIG. 1, 118) to govern the pivotal motion of the firing board (FIG. 1, 102) and may otherwise damage components of the fluid ejection controller (FIG. 1, 100) and/or the fluid ejection system (FIG. 2, 222). Accordingly, stops (330-1, 330-2) affixed to the housing (228) may prevent the over-rotation of the handle (108)/cam shaft (FIG. 1, 118) in either direction.

Figure 4:
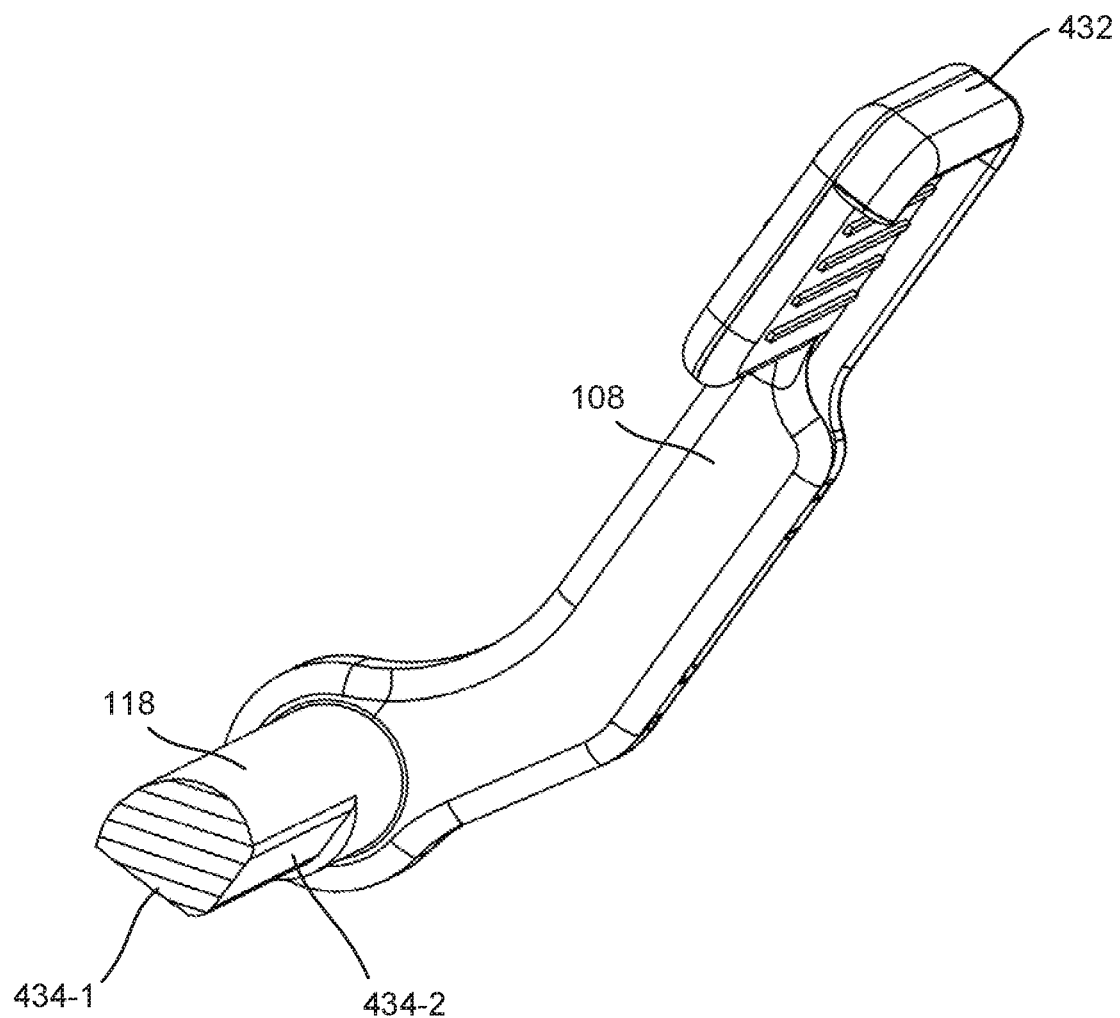
FIG. 4 is a diagram of a handle of the fluid ejection controller, according to an example of the principles described herein.

FIG. 4 is a diagram of the handle (108) of the fluid ejection controller (FIG. 1, 100), according to an example of the principles described herein. As described above, the handle (108) is coupled to a cam shaft (118) which moves the firing board (FIG. 1, 102) between a disengaged position and an engaged position. More specifically, the cam shaft (118) locks the firing board (FIG. 1, 102) in either the disengaged position and the engaged position. Accordingly, in some examples, the handle (108) and the cam shaft (118) have two stable positions, a first stable position corresponding to the disengaged position and a second stable position perpendicular to the first stable position corresponding to the engaged position. As used in the present specification and in the appended claims, the term stable position refers to a position wherein, in the absence of force, the component will remain in that position.

Figure 5:
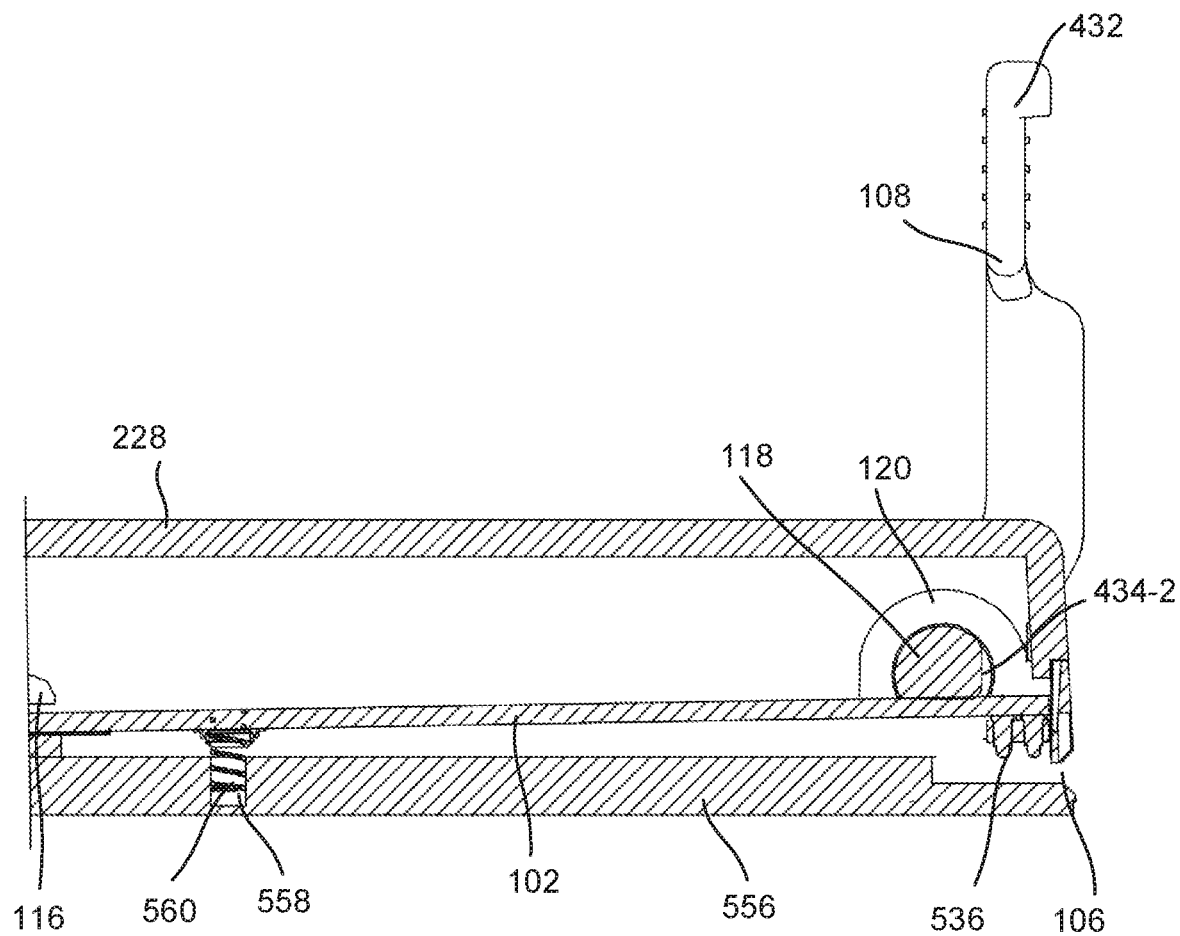
FIGS. 5 and 6 are cross-sectional diagrams of the fluid ejection controller, according to an example of the principles described herein.
Figure 6:
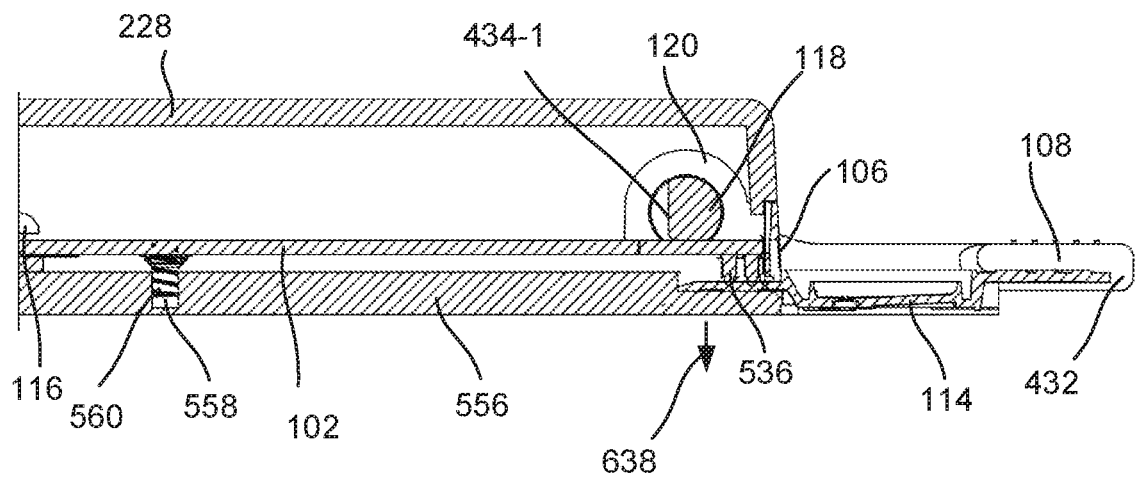

These stable positions are provided by flat surfaces (434) of the cam shaft (118). For example, when in a disengaged position, the top surface of the firing board (FIG. 1, 102) is flush against the first flat surface (434-1). FIG. 5 depicts an example of the handle (108) in the first stable position. Rotating the handle (108) towards the engaged position pushes the firing board (FIG. 1, 102) down such that the electrical pins contact the electrical pads (FIG. 1, 112). In this position, the top surface of the firing board (FIG. 1, 102) is flush against the second flat surface (434-2). FIG. 6 depicts an example of the handle (108) in the second stable position.

In some examples, the handle (108) includes other components. For example, the handle (108) may include a tab (432) to, when in the engaged position, block a removal of the fluid ejection device (FIG. 1, 114) from the slot (FIG. 1, 106). The tab (432) of the handle (108) extends in front of the fluid ejection device (FIG. 1, 114) in the slot (FIG. 1, 106) thus preventing a user from being able to insert or remove the fluid ejection device (FIG. 1, 114) while the handle (108) is in an engaged position. Doing so prolongs the life of the fluid ejection system (FIG. 2, 222). That is, once in the engaged position, the electrical pins depress against the electrical pads (FIG. 1, 112) of the fluid ejection device (FIG. 1, 114). Removal of the fluid ejection device (FIG. 1, 114) at this point in time may damage the electrical pins and/or electrical pads (FIG. 1, 112) rendering either of the fluid ejection system (FIG. 2, 222) and the fluid ejection device (FIG. 1, 114) inoperable.

FIGS. 5 and 6 are cross-sectional diagrams of the fluid ejection controller (FIG. 1, 100), according to an example of the principles described herein. Specifically, FIG. 5 depicts the fluid ejection controller (FIG. 1, 100) in a disengaged position. In this position, the firing board (102) is flush against a first flat surface (FIG. 4, 434-1) and the biasing springs (FIG. 1, 110) bias the firing board (102) away from the slot (106) where the fluid ejection device (FIG. 1, 114) is to be inserted. More specifically, in this state, the electrical pins (536) are moved away from the slot (106) where the fluid ejection device (FIG. 1, 114) is to be inserted.

FIG. 5 also clearly depicts the electrical pins (536) that interface with the electrical pads (FIG. 1, 112) when the fluid ejection device (FIG. 1, 114) is installed into the fluid ejection controller (FIG. 1, 100). Via this electrical connection, the fluid ejection device (FIG. 1, 114) is activated to eject a corresponding fluid. That is, through this connection, the fluid ejection device (FIG. 1, 114) receives electrical signals directing when, where, and how to eject an amount of fluid therefrom.

As described above, spring-loaded electrical pins (536) may be damaged or worn when disposable fluid ejection devices (FIG. 1, 114) are repeatedly inserted and rub against the electrical pins (536). By moving the electrical pins (536) away from the slot (106) via the biasing springs (FIG. 1, 110) underneath the firing board (102), the fluid ejection device (FIG. 1, 114) can be inserted without any contact with the fragile electrical pins (536).

FIG. 5 also clearly depicts one hook (116) that holds the floating firing board (102) in place. That is, as described above, the firing board (102) is pivotally coupled to the mount (FIG. 1, 104) at an end opposite the electrical pins (536) such that the firing board (102) pivots, but does not translate. In some examples, the firing board (102) rotates 1 degree, which is sufficient to remove the electrical pins (536) from the insertion path of the fluid ejection device (FIG. 1, 114).

In some examples, a fluid ejection device (FIG. 1, 114) is positioned for fluid ejection by sliding the fluid ejection device (FIG. 1, 114) into electrical contact with the fluid ejection controller (FIG. 1, 100). For example, a user may grasp the fluid ejection device (FIG. 1, 114), and slide it in the slot (106). Note that in FIG. 5, the electrical pins (536) are not yet contacting the electrical pads (FIG. 1, 112).

FIG. 5 also depicts other components. In some examples, the fluid ejection controller (FIG. 1, 100) includes a mounting surface (556) on which the mount (FIG. 1, 104) is placed. Such a mounting surface (556) may be formed of metal and may serve as a ground path for the firing board (102). That is, the firing board (102) which may be unfastened may rely on a grounding solution to prevent electrostatic discharge as it is next to metal components that could get charged, and possibly arc to undesired areas of the firing board (102). Accordingly, the fluid ejection controller (FIG. 1, 100) provides a path for charged metal parts to discharge to ground in a controlled and predictable manner. Accordingly, the fluid ejection controller (FIG. 1, 100), and more specifically the mounting surface (556) includes a fixture (558) to receive a ground spring (50) to provide a ground path for the firing board (102). In some examples, the fixture (558) may be a pocket in which the ground spring (560) sits. In another example, the fixture may be a dowel pin. In some examples, the firing board (102) includes a ground pad against which the ground spring (560) is compressed. As the ground spring (560) sits in the fixture (558) in a metal part, there is a clear grounding path from the metal mounting surface (556), through the ground spring (560), to the firing board (102), and eventually to ground. Accordingly, in this example, the firing board (102) that floats has been provided with a spring-based grounding path for the safety of the firing board (102) components and users.

As depicted in FIG. 5, in some examples, the fixture (55) and the ground spring (560) are disposed adjacent the hooks (116) and away from the slot (FIG. 1, 106) where the fluid ejection device (114) is inserted.

FIG. 6 depicts the fluid ejection controller (100) having been rotated into the engaged position. That is, a user operates the handle (108) to push the firing board (102) down in a direction indicated by the arrow (638). In this position, the firing board (102) is held in place as the handle (108) is in the second stable position wherein the firing board (102) is flush with the second flat surface (FIG. 4, 434-2).

As depicted in FIG. 6, the fluid ejection device (114) is fully seated within the fluid ejection controller (FIG. 1, 100). That is, the electrical pins (536) are in contact with the electrical pads (FIG. 1, 112) of the fluid ejection device (114).

As described above, the handle (108) may include a tab (432) which blocks the fluid ejection device (114) from removal during engagement. That is, if the slot (106) is not obstructed during electrical connection, a fluid ejection device (114) may be accidently removed by the user which can damage the electrical pins (536) or other components. To address this, the tab (432) on the handle (108) obstructs the slot (106) when the handle (108) and firing board (102) are in an engaged position. Such a fluid ejection controller (FIG. 1, 100) provides for mechanical engagement of the electrical pins (536) with the fluid ejection device (114) rather than relying on motorized engagement features. This eliminates the use a powered electrical engagement mechanism, which is prone to breaking down, is more complex to operate, and is more costly to manufacture.

A specific example of insertion of the fluid ejection device (114) is now provided. In this example, a fluid ejection device (114) is horizontally inserted into a slot (FIG. 1, 106). The handle (108), which has been in a disengaged position (90 degrees) depicted in FIG. 5, is rotated to an engaged position (0 degrees) depicted in FIG. 6. The engagement ensures a fluid ejection device (114) is laid flat since the electrical pins (536) on the firing board (102) push perpendicularly on the electrical pads (FIG. 1, 112) of a fluid ejection device (114) forcing planarity.

As described above, the handle (108) controls firing board (102) engagement to a fluid ejection device (114) with the help of the two flat surfaces (434-1, 434-2) and two springs (FIG. 1, 110-1, 110-2) located under the firing board (102) in a pocket. When the handle (108) is disengaged, i.e. rotated from 0 to 90 degrees, the two springs (FIG. 1, 110) under the firing board (102) push the firing board (102) vertically up moving the electrical pins (536) away from the slot (106). However, when the handle (108) is engaged, i.e., rotated down, the camshaft (118) compresses the two biasing springs (FIG. 1, 110), pushing the firing board (102) down, moving the electrical pins (536) into electrical contact with the electrical pads (FIG. 1, 112).

As described above, the bearings (120) that hold the cam shaft (118) portion of the handle (108) may be made of a polymer material such as a self-lubricating material or a material which has a very low coefficient of friction. Additionally, the biasing springs (FIG. 1, 110) that push the firing board (102) upwards have a high spring-rate. These two properties allow the handle (108) to turn from 0 degrees to a complete 90 degrees as force is applied to the tab (432) portion of the handle (108), while also providing a good feel for the handle (108) movement. This feature is helpful because if the handle (108) is partially rotated, say 45 degrees, the slot (106) may be un-obstructed and the electrical pins (536) may be partially visible through the slot (106), allowing a possibility for a user to insert a fluid ejection device (114) and wear-off the electrical pins (536).

Figure 7:
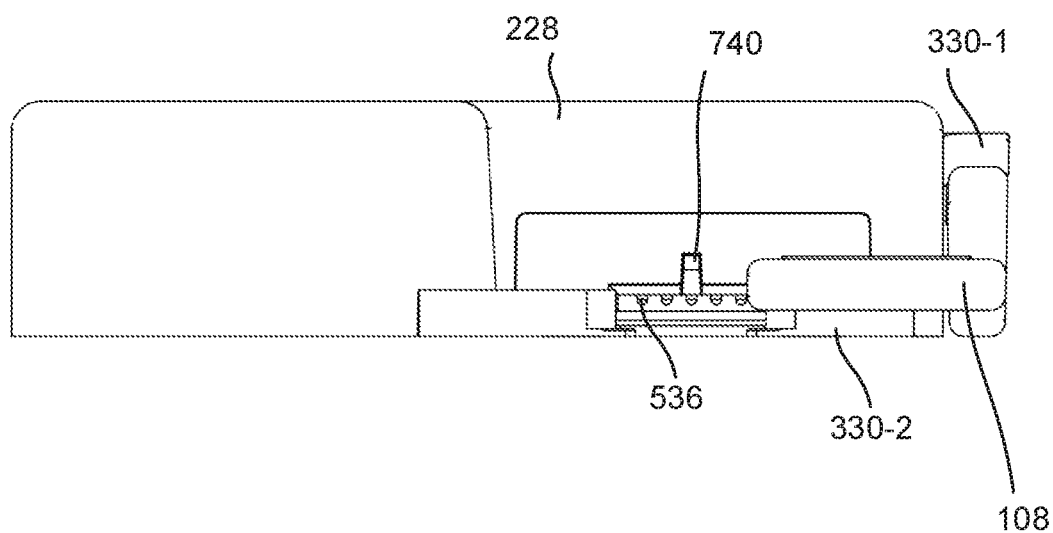
FIG. 7 is a zoomed in front view of the housing of the fluid ejection system for pivotally holding a fluid ejection firing board, according to an example of the principles described herein.

FIG. 7 is a zoomed in front view of a housing (228) of a fluid ejection system (FIG. 2, 222) for pivotally holding a fluid ejection firing board (FIG. 1, 102), according to an example of the principles described herein. In the example depicted in FIG. 7, a fluid ejection device (FIG. 1, 114) is not inserted such that the electrical pins (536) are clearly indicated. FIG. 7 also depicts the stops (330-1, 330-2) to prevent over rotation of the handle (108).

In some examples, the fluid ejection system (FIG. 2, 222) includes an indicator (740) which indicates when a fluid ejection device (FIG. 1, 114) is properly installed as determined by an electrical connection between the electrical pins (536) and the electrical pads (FIG. 1, 112). That is, once an electrical connection is established, the indicator (740) may be activated. As one specific example, the indicator (740) may be a light-emitting diode (LED) disposed on the housing (228) of the fluid ejection system (FIG. 2, 222) that turns a particular color, or turns on, or flashes, when there is an electrical connection between the electrical pins (536) and the electrical pads (FIG. 1, 112). Such an indicator (740) may indicate to a user that the fluid ejection device (FIG. 1, 114) is ready to be used.

Figure 8:
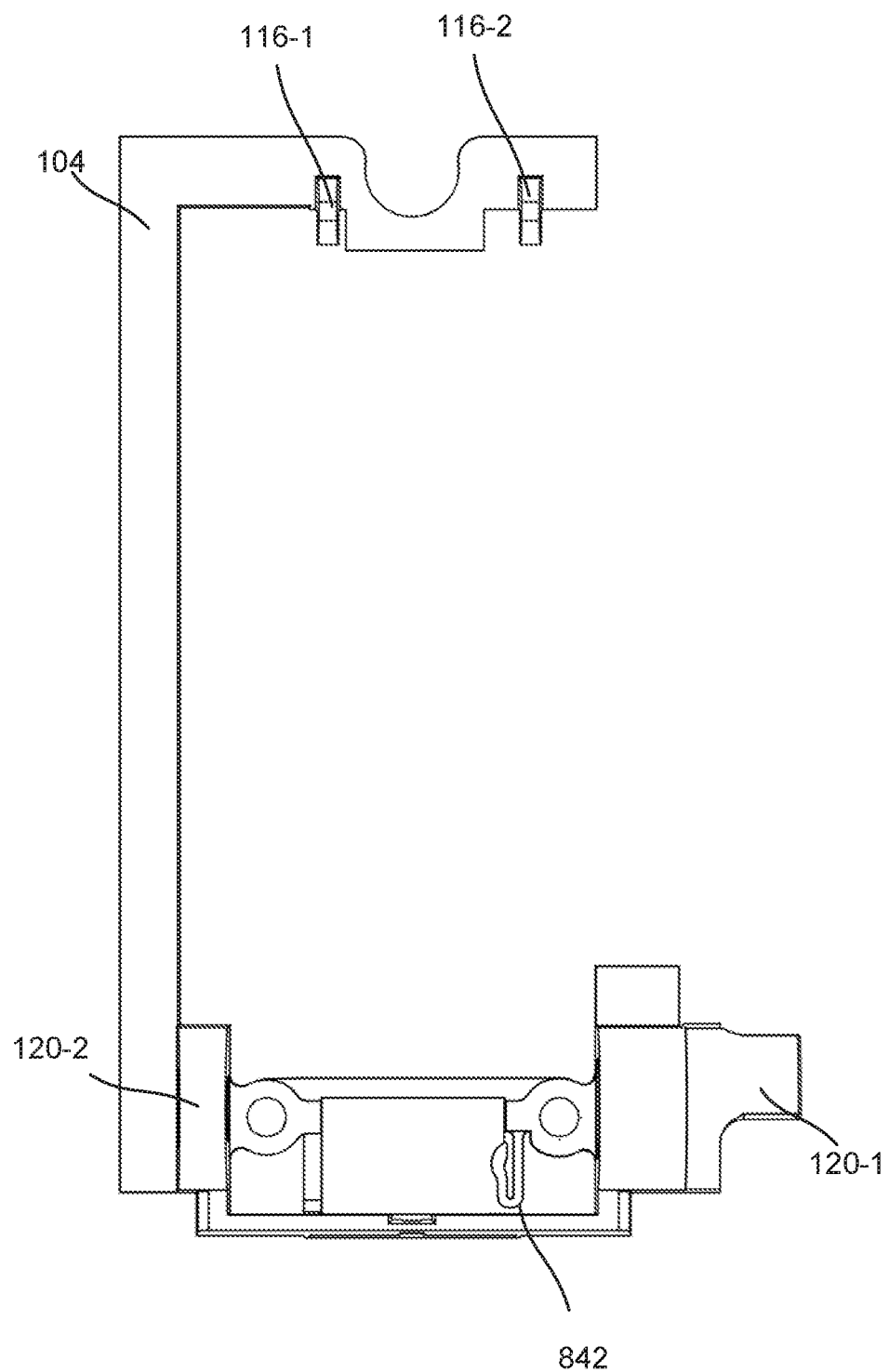
FIG. 8 is a top view of a mount of the fluid ejection controller for pivotally holding a fluid ejection firing board, according to an example of the principles described herein.

FIG. 8 is a top view of a mount (104) of the fluid ejection controller (FIG. 1, 100) for pivotally holding a fluid ejection firing board (FIG. 1, 102), according to an example of the principles described herein. As described above, the mount (104) pivotally holds the firing board (FIG. 1, 102) while preventing translation. Accordingly, hooks (116-1, 116-2) control the rear portion of the firing board (FIG. 1, 102) from moving in the z-direction (out of the page), and the bearings (120-1, 120-2) prevent the x-movement (left-to-right) of the firing board (FIG. 1, 102). That is, the firing board (FIG. 1, 102) extends between the bearings (120-1, 120-2) such that it cannot translate left to right as per the orientation of FIG. 8.

Moreover, the position of the cam shaft (FIG. 1, 118) over the firing board (FIG. 1, 102) and the biasing springs (FIG. 1, 110) under the firing board (FIG. 1, 102) prevent motion in the z-direction. The y-movement (top to bottom of the page) of the firing board (FIG. 1, 102) is prevented via the hook (116) and the bearings (120). That is, the firing board (FIG. 1, 102) may extend and be adjacent to these surfaces to prevent movement in the up/down direction as per the orientation of FIG. 8.

FIG. 8 also depicts an additional component. That is, in some examples, the mount (104) includes a spring wall (842) disposed in the slot (FIG. 1, 106) to bias the fluid ejection device (FIG. 1, 114) within the slot (FIG. 1, 106). That is, protruding into the slot (FIG. 1, 106) is a spring wall (842) on the mount (104) which aligns, positions, and holds a manually inserted fluid ejection device (FIG. 1, 114) in place. The spring wall (842) also provides a tactile feedback to the user. That is, as a user inserts a fluid ejection device (FIG. 1, 114) there is resistance provided by the spring wall (842). However, the spring wall (842) interfaces with a corresponding alignment feature in the fluid ejection device (FIG. 1, 114) to position the fluid ejection device (FIG. 1, 114) in the slot (FIG. 1, 106). That is, during insertion, there may be some resistance to insertion of the fluid ejection device (FIG. 1, 114) into the slot (FIG. 1, 106). However, when fully seated, the resistance is removed and a user knows the fluid ejection device (FIG. 1, 114) is properly inserted.

Such a spring wall (842) provides reliable fluid ejection device (FIG. 1, 114) positioning and accuracy in dispensing applications that involve instrument jittering and patterning protocols. That is, a manually inserted fluid ejection device (FIG. 1, 114) into a slot (FIG. 1, 106) can lead to unreliable positioning of the fluid ejection device (FIG. 1, 114) due to variations in insertion forces and due to changes in the width of the slot (FIG. 1, 106) considering molded-part tolerances. This can cause inconsistency in the jetted fluid drop location from printhead-to-printhead during ejection. Moreover, instrument jittering can cause the fluid ejection device (FIG. 1, 114) to move inside the fluid ejection system (FIG. 2, 222) causing unreliable jetting location and fluid spillage. Such a spring wall (842) can be used to align and bias a fluid ejection device (FIG. 1, 114) to be positioned at the same location and hold it firmly in place with sufficient sidepressure on the latter during a dispense operation. That is, the fluid ejection device (FIG. 1, 114), with the help of force applied by the spring wall (842), remains stable during dispensing that may involves jitters. Such a spring wall (842) mitigates spillage of fluid within the cassette.

The spring wall (842) may take many forms. For example, as depicted in FIG. 8, the spring wall (842) may include a single connection to the mount (104) frame. The spring wall (842) as with the rest of the mount (104) may be formed out of a polymer material such as a self-lubricating material or a material with a low coefficient of friction such as polyoxymethylene to accommodate the friction forces experienced during the numerous iterations of insertion and removal. In some examples, the spring wall (842) may be 600 microns thick or less and may be 3.1 millimeters tall such that it may flex as a fluid ejection device (FIG. 1, 114) is inserted into the slot (106).

Figure 9:
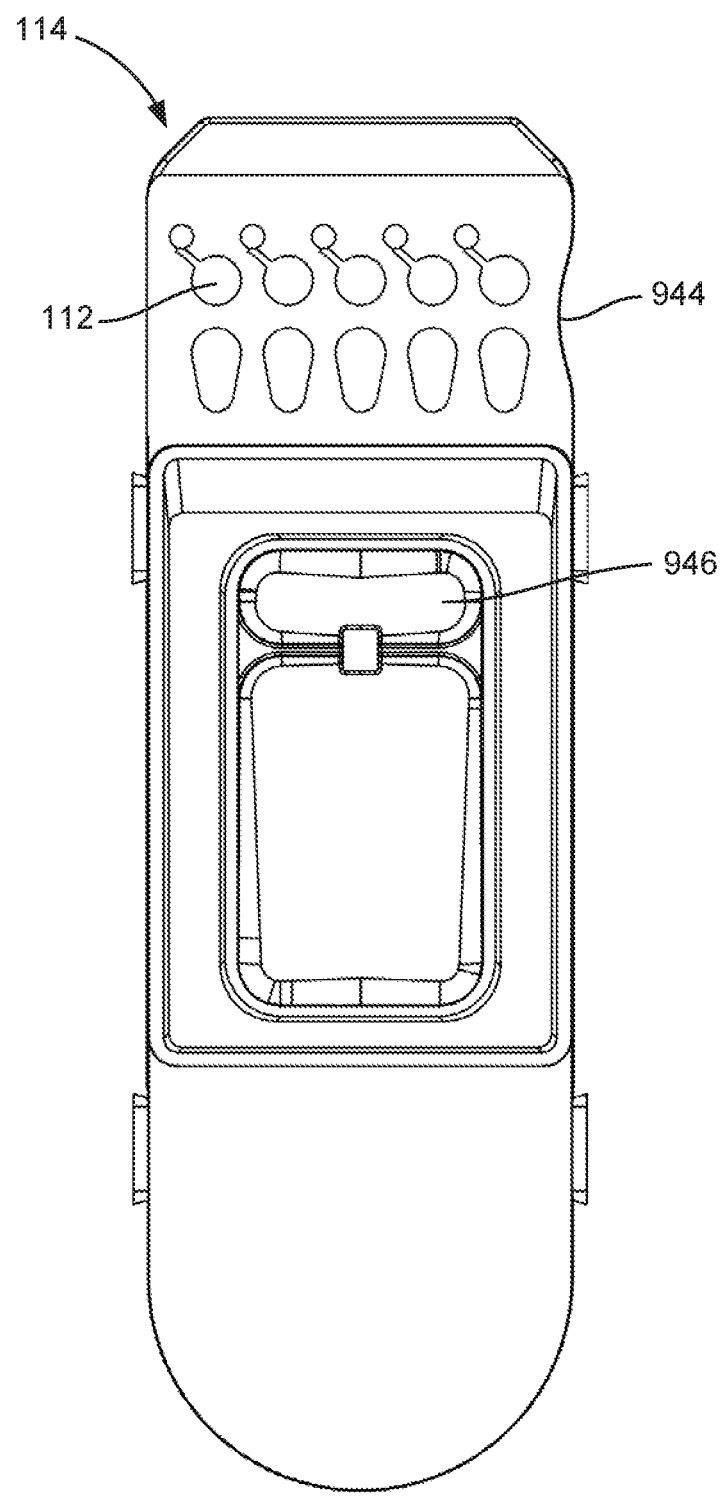
FIG. 9 is a top view of a fluid ejection device for insertion into the fluid ejection system, according to an example of the principles described herein.

FIG. 9 is a top view of a fluid ejection device (114) for insertion into the fluid ejection system (FIG. 2, 222), according to an example of the principles described herein. As described above, the fluid ejection device (114) refers to the component that ejects the fluid. In some cases, the fluid ejection device (114) operates to dispense picoliter quantities of a target fluid into wells of a titration plate.

The fluid ejection device (114) includes a number of components to eject fluid. First, each fluid ejection device (114) includes a reservoir (946) which receives fluid. The reservoir (946) may be exposed to atmosphere such that fluid can be dispensed therein without having to remove a cap. That is, a user may insert fluid directly into the reservoir (946) using a single-channel or multi-channel pipette. The reservoir (946) may have a narrower opening at the bottom to deliver the fluid to respective fluid die on the underside of the fluid ejection device (114).

Each fluid ejection device (114) also includes an array of nozzles to eject a fluid. Each nozzle includes a number of components. For example, a nozzle includes an ejection chamber to hold an amount of fluid to be ejected, an opening through which the amount of fluid is ejected, and a fluid actuator, disposed within the ejection chamber, to eject the amount of fluid through the opening. In some examples, the components are inkjet components, such as a firing resistor. Using inkjet components such as ejection chambers, openings, and fluid actuators disposed within the micro-fluid ejection chambers, enables low-volume dispensing of fluids such as those used in life science and clinical applications.

In some examples the fluid ejection device (114) also houses circuitry to activate each of the fluid actuators. That is, each of the fluid actuators may be individually addressable and may activate based on control signals from a fluid ejection controller (FIG. 1, 100). Specifically, the frame includes electrical pads (112). These electrical pads (112) interface with corresponding connections on a fluid ejection controller (FIG. 1, 100) to pass control signals.

FIG. 9 also clearly depicts the alignment feature (944) that interfaces with the spring wall (FIG. 8, 842). Additional detail regarding the alignment feature (944) interaction with the spring wall (FIG. 8, 842) is provided in connection with FIG. 10.

Figure 10:
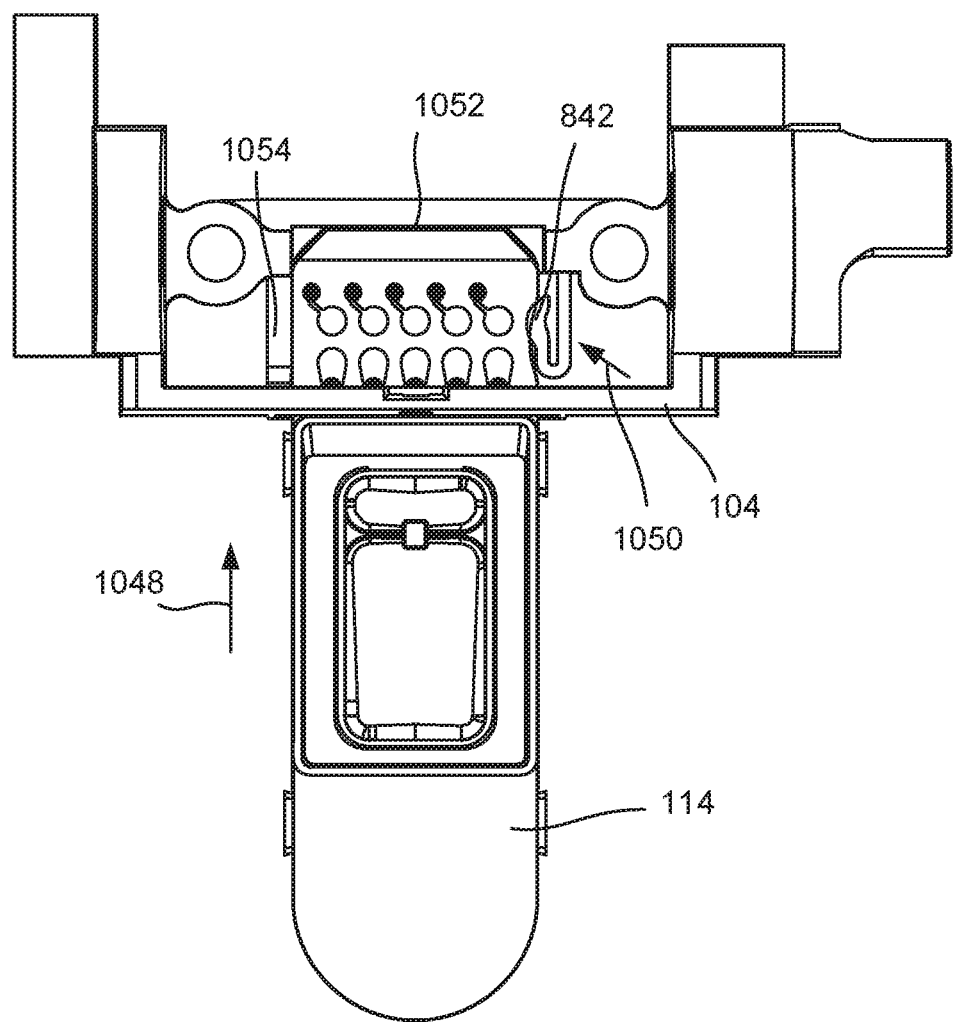
FIG. 10 is a top view of a fluid ejection device disposed within the mount, according to an example of the principles described herein.

FIG. 10 is a top view of a fluid ejection device (114) disposed within the mount (104), according to an example of the principles described herein. As the fluid ejection device (114) is slid into the slot (FIG. 1, 106) in a direction indicated by the arrow (1048), the edge surface of the fluid ejection device (114) deflects the spring wall (842) which resists the insertion force. However, the alignment feature (FIG. 9, 944) of the fluid ejection device (114) reduces this force when the fluid ejection device (114) is fully seated. Once fully seated, the spring wall (842) continues to exert a force on the fluid ejection device (114) in the direction indicated by the arrow (1050) to push the fluid ejection device (114) against a first surface (1052) of the mount (104) and a second surface (1054) of the mount (104). That is, the fluid ejection device (114) includes a dent feature against which the spring wall (842) pushes while attaining its free state. Accordingly, the fluid ejection device (114) is biased in two directions (against the first surface (1052) and the second surface (1054)) and the compression of the spring wall (842) maintains the fluid ejection device (114) in place. Such a spring wall (842) thereby ensures that the fluid ejection device (114) is stationary during any dispensing operation and also ensures similar positioning of the fluid ejection device (114) throughout different dispensing cycles. Thus, introducing reliability into any ejection operation.

That is, the spring wall (842) interaction with the corresponding alignment feature (FIG. 9, 944) on the fluid ejection device (114) provides reliable locational fixturing of the fluid ejection device (114) within the fluid ejection system (FIG. 2, 222) which leads to consistency in dispensed drop location in patterning applications. The spring wall (842) also provides sufficient side pressure on the fluid ejection device (114) to keep it immovable and to withstand vibrations during the fluid ejection operation which can arise due to movement of fluid ejection system (FIG. 2, 222) components during fluid ejection. Integrating the spring wall (842) with in the mount (104) eliminates the use of an additional part for fluid ejection device (114) stability, therefore reducing the instrument cost.

Figure 11:
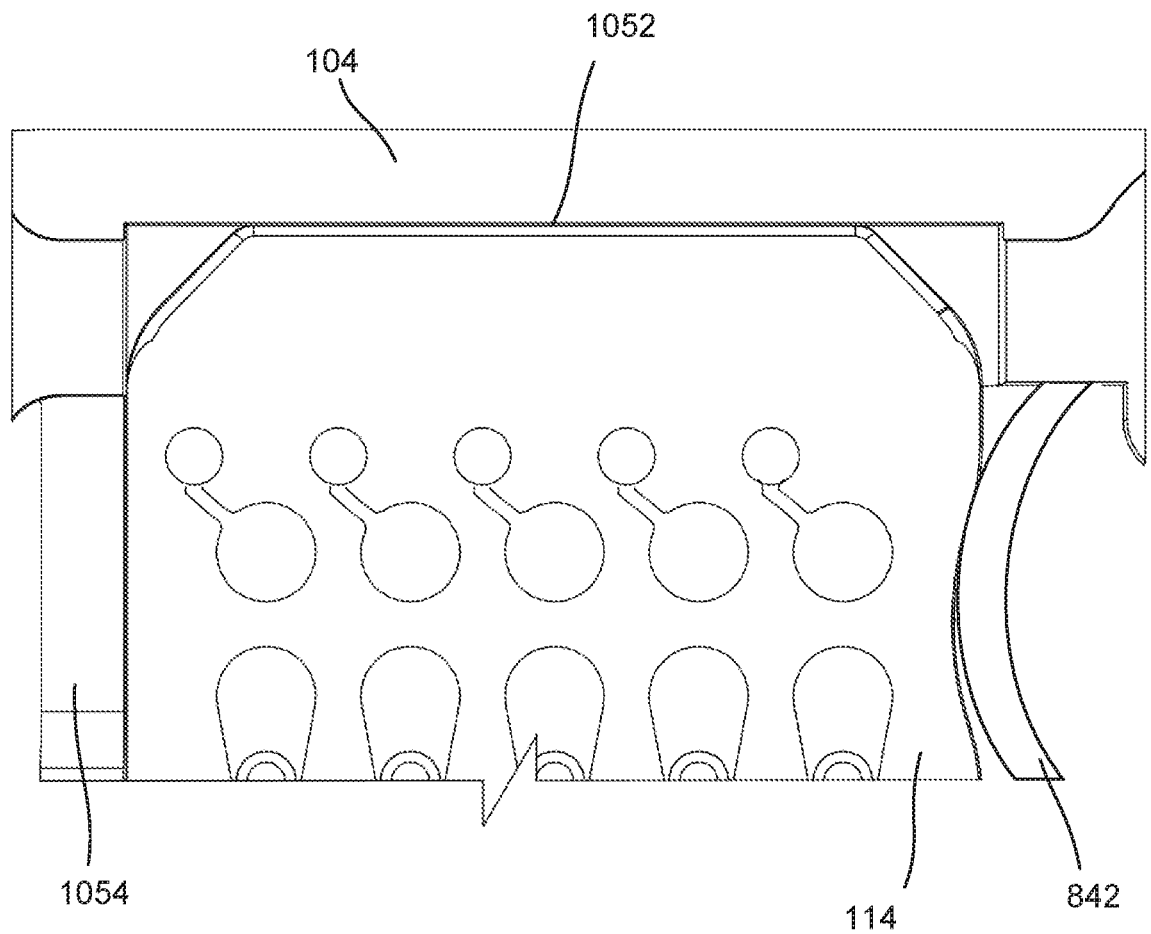
FIG. 11 is a top view of a fluid ejection device disposed within the mount, according to another example of the principles described herein.

FIG. 11 is a top view of a fluid ejection device (114) disposed within the mount (104), according to another example of the principles described herein. In this example, the spring wall (842) comprises multiple connections with the mount (104) frame. That is, such a system may prolong the life of the fluid ejection system (FIG. 2, 222) as a component that experiences reduced stress has a reduced likelihood of failure.

In summary, using such a fluid ejection controller with a floating firing board 1) reduces fluid ejection system cost; 2) is more robust in that it protects the electrical pins by holding the electrical pins away from the slot with help of biasing springs underneath the firing board while the user disengages the connection by rotating a cam-style handle; 3) reduces likelihood of accidental cassette removal or insertion; 4) enhances connector reliability with slot obstructing feature; and 5) provides a visual aid as to when the cassette is properly inserted and fluid ejection may begin. However, it is contemplated that the devices disclosed herein may address other matters and deficiencies in a number of technical areas.

What is claimed is:

1. A fluid ejection controller, comprising:
a firing board to pass control signals to a fluid ejection device to eject fluid from the fluid ejection device;
a mount to pivotally hold the firing board between a disengaged position wherein electrical pins of the firing board are not in contact with electrical pads of the fluid ejection device and an engaged position wherein the electrical pins are in contact with the electrical pads, the mount comprising:
a slot to receive the fluid ejection device; and
at least one biasing spring to bias the firing board away from the fluid ejection device during insertion of the fluid ejection device; and
a handle coupled to a cam shaft to move the firing board between the disengaged position and the engaged position.

2. The fluid ejection controller of claim 1, wherein the firing board is to pivotally couple to the mount at an end opposite the electrical pins such that the firing board pivots but does not translate.

3. The fluid ejection controller of claim 1, wherein the at least one biasing spring comprises two biasing springs on either side of the slot.

4. The fluid ejection controller of claim 1, wherein the handle comprises a tab to, when in the engaged position, block a removal of the fluid ejection device from the slot.

5. The fluid ejection controller of claim 1, wherein the mount is formed of a polymer material.

6. The fluid ejection controller of claim 1, wherein the mount further comprises a spring wall disposed in the slot to bias the fluid ejection device within the slot.

7. The fluid ejection controller of claim 6, wherein:
the spring wall comprises a single connection with a mount frame; and
the spring wall interfaces with a corresponding alignment feature in the fluid ejection device to position the fluid ejection device in the slot.

8. The fluid ejection controller of claim 6, wherein:
the spring wall comprises multiple connections with a mount frame; and
the spring wall interfaces with a corresponding alignment feature in the fluid ejection device to position the fluid ejection device in the slot.

9. A fluid ejection system, comprising:
a base;
a stage disposed on the base to receive a substrate onto which fluid is ejected;
a housing vertical to the stage to hold a fluid ejection controller, the fluid ejection controller comprising:
a firing board to pass control signals to a fluid ejection device to eject fluid from the fluid ejection device;
a mount to pivotally hold the firing board between a disengaged position wherein electrical pins of the firing board are not in contact with electrical pads of the fluid ejection device and an engaged position wherein the electrical pins are in contact with the electrical pads, the mount comprising:
- a slot to receive the fluid ejection device; and
- at least one biasing spring to bias the firing board away from the fluid ejection device during insertion of the fluid ejection device; and
- a handle coupled to a cam shaft to move the firing board between the disengaged position and the engaged position.

10. The fluid ejection system of claim 9, further comprising an indicator to indicate when the fluid ejection device is properly installed as determined by an electrical connection between the electrical pins and the electrical pads.

11. The fluid ejection system of claim 9, wherein the housing comprises at least one stop to define a range of motion of the handle.

12. The fluid ejection system of claim 9, wherein the handle has a first stable position corresponding to the disengaged position and a second stable position corresponding to the engaged position.

13. A fluid ejection controller, comprising:
- a floating firing board comprising spring-loaded electrical pins to compress against electrical pads on a fluid ejection device to pass control signals to eject fluid from the fluid ejection device;
- a mount to pivotally hold the firing board between a disengaged position wherein the spring-loaded electrical pins are not in contact with the electrical pads and an engaged position wherein the electrical pins are in contact with the electrical pads, the mount comprising:
  - a hook at one end to pivotally retain the floating firing board;
  - a slot at an opposite end to receive the fluid ejection device;
  - at least one biasing spring on one side of the floating firing board to bias the firing board away from the fluid ejection device during insertion of the fluid ejection device; and
  - at least one bearing to rotationally couple a handle to the mount; and
- the handle coupled to a cam shaft on a second side of the floating firing board to move the firing board between the disengaged position and the engaged position; and
- a mounting surface on which the mount is placed.

14. The fluid ejection controller of claim 13, wherein the mounting surface comprises a fixture for a ground spring to provide a ground path for the firing board.

15. The fluid ejection controller of claim 14, wherein the fixture is disposed adjacent the hook.

* * * * *